US009691871B1

(12) United States Patent
Caubet et al.

(10) Patent No.: US 9,691,871 B1
(45) Date of Patent: Jun. 27, 2017

(54) PROCESS FOR FORMING A LAYER OF EQUIAXED TITANIUM NITRIDE AND A MOSFET DEVICE HAVING A METAL GATE ELECTRODE INCLUDING A LAYER OF EQUIAXED TITANIUM NITRIDE

(71) Applicants: STMicroelectronics (Crolles 2) SAS, Crolles (FR); STMicroelectronics SA, Montrouge (FR)

(72) Inventors: Pierre Caubet, Le Versoud (FR); Florian Domengie, Crolles (FR); Carlos Augusto Suarez Segovia, Grenoble (FR); Aurelie Bajolet, Biviers (FR); Onintza Ros Bengoechea, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 14/973,825

(22) Filed: Dec. 18, 2015

(51) Int. Cl.
*H01L 21/76* (2006.01)
*H01L 29/49* (2006.01)
*H01L 29/40* (2006.01)

(52) U.S. Cl.
CPC ........ *H01L 29/4941* (2013.01); *H01L 29/401* (2013.01)

(58) Field of Classification Search
CPC . H01L 29/6659; H01L 29/7835; H01L 21/76; H01L 21/768; H01L 21/76895; H01L 21/76805; H01L 21/8238; H01L 21/76843; H01L 21/76838; H01L 21/76897; H01L 21/76802

USPC .......................................... 257/368
See application file for complete search history.

(56) References Cited

U.S. PATENT DOCUMENTS

| 5,279,191 A * | 1/1994 | Buljan | C04B 35/117 407/119 |
| 2002/0056874 A1* | 5/2002 | Ohtake | H01L 21/28061 257/336 |
| 2014/0327064 A1* | 11/2014 | Iizuka | C23C 16/405 257/310 |
| 2016/0336227 A1* | 11/2016 | Chen | H01L 21/76895 |

OTHER PUBLICATIONS

Thornton, John A.: "Influence of Apparatus Geometry and Deposition Conditions on the Structure and Topography of Thick Sputtered Coatings," J. Vac. Sci. Technol., vol. 11, No. 4 Jul./Aug. 1974 (5 pages).

* cited by examiner

*Primary Examiner* — Chuong A Luu
(74) *Attorney, Agent, or Firm* — Gardere Wynne Sewell LLP

(57) ABSTRACT

Local variability of the grain size of work function metal, as well as its crystal orientation, induces a variable work function and local variability of transistor threshold voltage. If the metal nitride for the work function metal of the transistor gate is deposited using a radio frequency physical vapor deposition, equiaxed grains are produced. The substantially equiaxed structure for the metal nitride work function metal layer (such as with TiN) reduces local variability in threshold voltage.

18 Claims, 7 Drawing Sheets

US 9,691,871 B1

PROCESS FOR FORMING A LAYER OF EQUIAXED TITANIUM NITRIDE AND A MOSFET DEVICE HAVING A METAL GATE ELECTRODE INCLUDING A LAYER OF EQUIAXED TITANIUM NITRIDE

FIELD OF THE INVENTION

The present disclosure generally relates to integrated circuit transistors and, in particular, to a metal oxide semiconductor field effect transistor (MOSFET) device having a metal gate electrode with an equiaxed titanium nitride layer.

BACKGROUND

Those skilled in the art are familiar with the structure and operation of metal oxide semiconductor field effect transistor (MOSFET) devices. Such devices include source, drain and channel regions formed in a semiconductor substrate as well as a gate formed over the channel region. The gate includes a gate oxide layer and a conductive gate stack insulated from the channel region by the gate oxide layer. The conductive gate stack may, for example, include a layer of a metal nitride (for example, titanium nitride TiN) physically adjacent the gate oxide and one or more other metal layers and/or semiconductor layers over the metal nitride layer.

It is often important for two or more MOSFET devices of an integrated circuit to be designed identically, in an identical environment, and operated identically. However, two identically designed MOSFET devices placed side by side in an integrated circuit may operate differently such as by having slightly different threshold voltages (Vt). Indeed, as the sizes (width and/or length) of the designed transistors decreases, experimentation has shown that the local variability of threshold voltage between identical transistors increases for dimensions above 1 μm (for length) or 1 μm² (for surface area=length×width). This can be a problem when correct circuit operation relies on the use of matched transistors.

One source of threshold voltage variability is traced to the work function (WF) of the metal gate. More specifically, the metal gate WF depends on orientation of the grains for the WF material. Taking TiN as an example, a crystallographic orientation of (200) has a corresponding WF of 4.6 eV while a crystallographic orientation of (111) has a corresponding WF of 4.4 eV. There is a corresponding increase in threshold voltage variability with grain size for the WF material.

A solution to the concern with threshold voltage variability is to reduce WF material variation among otherwise identically designed transistor devices. For example, a long duration and high temperature metal gate deposition process can achieve large grain size of a single orientation. Conversely, a short duration and low temperature metal gate deposition process can produce no grain growth, with a large number of small grains yielding a negligible WF variation. In an ideal case, an amorphous metal gate is preferred.

The foregoing is illustrated in FIGS. 1A-1C, 2A-2C and 3A-3D. FIGS. 1A-1C illustrate a metal nitride layer 10 over a high-k dielectric layer 12 such as would be common for use in a MOSFET device supported on a substrate 14 that would include the drain, source and channel regions. The characteristics of the high-k dielectric layer 12 are the same in each of FIGS. 1A-1C. The morphology of the metal nitride layer 10, however, differs across FIGS. 1A-1C. FIG. 1A illustrates a morphology characterized by relatively larger-size grains (for example, >10 nm) referred to as category I. FIG. 1B illustrates a morphology characterized by nano-sized grains (for example, 1-10 nm) referred to as category II. FIG. 1C illustrates a morphology characterized by amorphous material, or nanocrystallites with a size <1 nm, referred to as category III. With respect to the grains in FIGS. 1A and 1B, the grains may exhibit different crystallographic orientations. For example, the grains may have a (110) orientation 16, a (100) orientation 18 or a (111) orientation 20 (it being understood that these orientations are merely examples not to be considered limiting). With reference to FIGS. 2A-2C, the work function (WF) φ is shown for three different types of materials (Type A in FIG. 2A, Type B in FIG. 2B and Type C in FIG. 2C) over three different grain orientations. In type A, the film is strongly textured in a single preferential grain orientation. In type B, the film has a few grain orientations of equivalent importance. In type C, the film has no preferential grain orientation. It will be noted that a significant variation in WF can arise with respect different material types in different crystallographic orientations. FIGS. 3A-3C show variation in work function φ along a distance for different combinations of the morphology of FIGS. 1A-1C and material type of FIGS. 2A-2C. For example, FIG. 3A shows the variation in φ as a function of distance for a category I morphology and a Type A material. FIG. 3B shows the variation in φ as a function of distance for a category I morphology and a Type B material. FIG. 3C shows the variation in φ as a function of distance for a category III morphology and a Type C material. As noted above, FIG. 3C shows than an amorphous metal gate (or with nano grains of size <1 nm) would be preferred with respect to work function variation because orientation is averaged over many different tiny grains. However, subsequent thermal budgets needed to complete the MOSFET manufacturing process (e.g. Source/Drain anneal, raised Source/Drain epitaxy) will cause the recrystallization of the amorphous metal gate. The inventors have noticed that when amorphous titanium nitride (TiN) is deposited to form the gate work function material, the amorphous TiN tends to recrystallize in columnar structure, corresponding to a morphology of Type I in relation to FIG. 3A. This nullified the potential benefit of amorphous TiN for so-called Gate-First MOSFET integration or for MOSFET devices on Fully Depleted Silicon On Insulator (FD-SOI).

With respect to TiN as a work function material, those skilled in the art understand that conventional semiconductor processes, such as physical vapor deposition (PVD), chemical vapor deposition (CVD) and atomic layer deposition (ALD), for the deposit of a TiN layer produces a micromorphology that is characterized as being columnar. A columnar structure exhibits well-defined crystallographic planes producing an angular profile of deposit surfaces. The structure is a dense structure of contiguous columns of material. FIG. 4A shows a cross-sectional image of MOSFET device at an intermediate manufacturing process step, including a semiconductor substrate 14, high-k dielectric layer 12 (not yet etched) and a TiN layer 10', wherein the TiN layer 10' exhibits a columnar micromorphology, a polysilicon gate electrode 30, and a sidewall spacer 32. The structure of the gate stack has a relatively smooth interface 34 between the TiN layer 10' and the polysilicon gate electrode 30. Furthermore, TiN layer 10' exhibits relatively well defined columns 36 (shown in more detail in FIG. 4B). In this regard, columnar grains are noted to be elonged in one direction (for example, in the illustration of FIG. 4B, elongated in a direction perpendicular to the substrate). Such columnar structures are notably more brittle and subject to decohesion when exposed to shock.

The deposition temperature for TiN is, for example, less than 500° C. (which is much lower than the melting point of 2930° C.) in conventional semiconductor processing, and thus it is not possible to achieve an equiaxed grain structure using the conventional processes. The columnar structure of the TiN layer 10' will accordingly result in undesirable work function variation as shown by FIGS. 3A-3C.

It is further noted that if the deposition of TiN is performed at a high temperature (for example, >300° C.), then there is a risk that the nitrogen added to dielectric gate oxide (for example, made of SiON or high-k materials such as HfSiON or HfON) for the purpose of adjusting the centering of the transistor device will be desorbed. Thus, conventional semiconductor processes used for deposition of the TiN WF metal require an even lower process temperature less than 100° C. (for example, at or about 20° C.) to ensure that the nitrogen is not desorbed.

There is a need in the art for a semiconductor process for the deposition of TiN for the WF metal of a MOSFET conductive gate stack that will produce a micromorphology that is characterized as having equiaxed grains.

SUMMARY

In an embodiment, an integrated circuit comprises: a substrate; a gate oxide layer deposited over the substrate; a work function metal nitride layer deposited over the gate oxide layer; a gate electrode layer deposited over the work function metal nitride layer; wherein the work function metal nitride layer is made of equiaxed grains. It is important that the equiaxed film must be the first material above the gate oxide, because the first nanometers of film above the gate oxide set the gate workfunction, and thus the transistor threshold voltage.

In an embodiment, a method comprises: depositing a gate oxide layer over a substrate; depositing a work function metal nitride layer over the gate oxide layer; depositing a gate electrode layer over the work function metal nitride layer; wherein depositing the work function metal nitride layer comprises using a deposition process that produces the work function metal nitride layer with equiaxed grains.

In an embodiment, the work function metal nitride layer is deposited using a physical vapor deposition in radio frequency mode (RF-PVD).

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION

Figure 5:
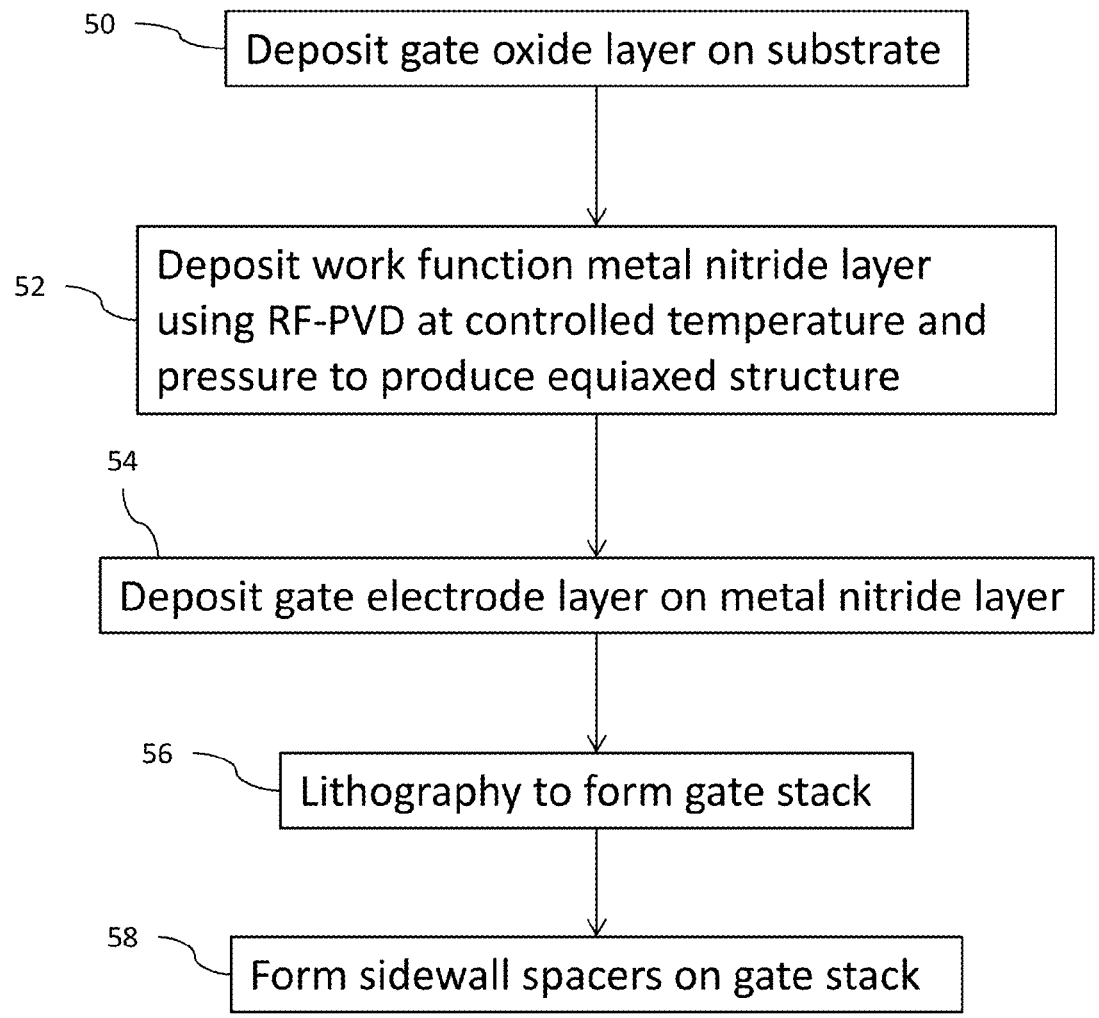
FIG. 5 is process flow diagram.

Reference is now made to FIG. 5 showing a process flow diagram for the formation of a transistor gate region.

In step 50, a deposition of a gate oxide layer is made on a semiconductor substrate. The gate oxide may be deposited using a chemical vapor deposition (CVD) or atomic layer deposition (ALD) process. Such process usually requires an organometallic of halide precursor, and an oxidant reactant for the silicon oxide or metal oxide deposition. The process can also eventually include an additional reactant for nitrogen source. Then usually a nitridation is performed to enrich the film in nitrogen, and a post nitridation anneal is carried out to fix nitrogen inside the film. The gate oxide may, for example, comprise a high-k dielectric material such as HfSiON or HfON. The gate oxide may, for example, have a thickness of 2 nm. The semiconductor substrate may, for example, comprise a bulk substrate, a silicon on insulator (SOI) substrate, a fin structure of the type commonly used in finFET devices, or any other suitable semiconductor structure containing source, drain and channel regions of a transistor. In high-k dielectrics, some nitrogen can eventually be added to change the dielectric constant and then tune the Capacitance Equivalent Thickness (CET). Nitrogen has also a benefic impact of current leakage inside gate oxide, and then on threshold voltage and device consumption.

In step 52, a deposition of a work function metal nitride layer is made on the gate oxide layer. The work function metal nitride layer may, for example, comprise a titanium nitride (TiN) material. The deposition is made using a physical vapor deposition (PVD) process in radio frequency mode (RF-PVD). For a Gate-First integration scheme, where the work function metal nitride is deposited in planar mode and where highly uniform and continuous thin films are desirable (since work function metal thickness modulates threshold voltage of the MOSFET), PVD or RF-PVD deposition of the work function metal nitride is performed at low pressure, typically 2 to 5 mTorr. The inventors have modified a standard commercial RF-PVD chamber by mounting on it a 'mid-position gate valve' (a gate valve between the chamber and its cryopump which has an additional, adjustable mid-opening position, in addition to the usual fully-open and fully-close positions; this allows to throttle the cryopump and to achieve higher process pressure without using too high gas flow conditions and without decreasing the cryopump pumping capacity) and have discovered, quite surprisingly, that RF-PVD with controlled temperature and higher pressure can produce an equiaxed TiN film layer. The following table provides an example of the process parameters used in RF-PVD for step 52 (where "Test" designates a point of reference only):

| Deposition Parameter | Test | Ranges | |
|---|---|---|---|
| Power DC (W) | 700 | 300 | 1000 |
| Power RF (W) | 600 | 100 | 1000 |
| Argon flow (sccm) | 20 | 5 | 50 |
| Nitrogen flow (sccm) | 45 | 15 | 100 |

| Deposition Parameter | Test | Ranges | |
|---|---|---|---|
| Pressure during deposition (mTorr) | 10 | 7 | 50 |
| Temperature (° C.) | 20 | −10 | 100 |

First, the wafer must be degased in a dedicated chamber at a temperature no more 200° C. and for a duration preferably no more than 30 seconds to remove moisture. Then the wafer is introduced inside the RF-PVD chamber. This chamber must be equipped with a pedestal set at the appropriate temperature, and hardware to clamp the wafer on the chuck. A gas vector at the backside of the wafer must also be used for good heat exchange. After wafer clamping (for example 1 second), temperature and process pressure stabilization (for example, 10 mTorr during 60 seconds, using Ar 20 sccm and nitrogen 45 sccm), the plasma is turned on with only RF power (for example, 1 second using RF 600 W). Then DC power is turned on during the appropriate time to reach the desired film thickness (for example, DC 700 W during 60 to 100 seconds). After that, DC power is turned off first (for example, during 0.5 second), and then finally RF power. At the end, the chamber is pumped down (for example, during at least 10 seconds).

Importantly, the RF-PVD process as described above is performed at a low enough temperature to ensure that the nitrogen added to the gate oxide layer for adjusting the centering of the transistor device is not desorbed.

In step 54, a deposition of a gate electrode layer is made on the metal nitride layer. The gate electrode may be deposited using a CVD process. For example we can use polysilicon deposited inside a furnace at 600° C. using a silane precursor. The gate electrode may, for example, comprise a polysilicon material or a metal material (such as aluminum, tungsten, copper, etc.). The gate electrode layer may, for example, have a thickness of 50 nm.

In step 56, conventional lithographic processing techniques are used to pattern the gate electrode layer and the work function metal nitride layer to form a gate stack insulated from the substrate by the gate oxide layer.

In step 58, sidewall spacers are formed on at least the side surfaces of the gate stack.

Figure 1A:
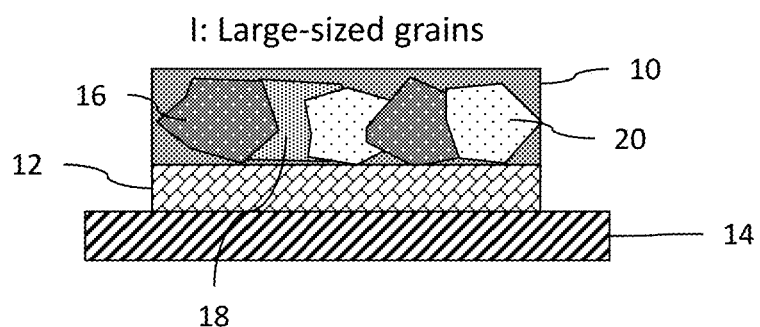
FIGS. 1A-1C illustrate morphologies.
Figure 1B:
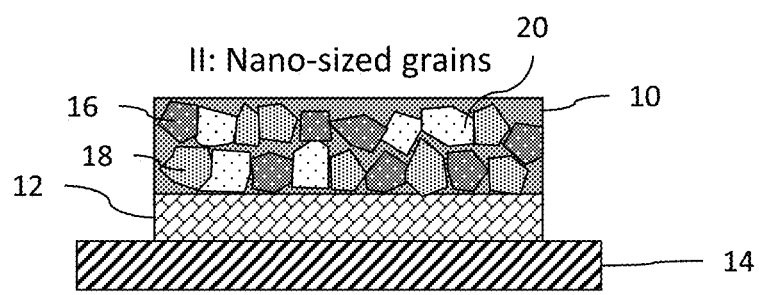
Figure 1C:
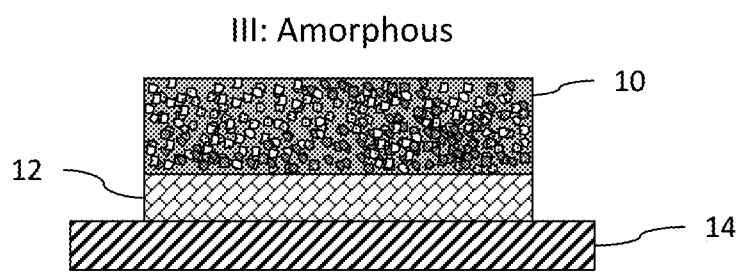
Figure 2A:
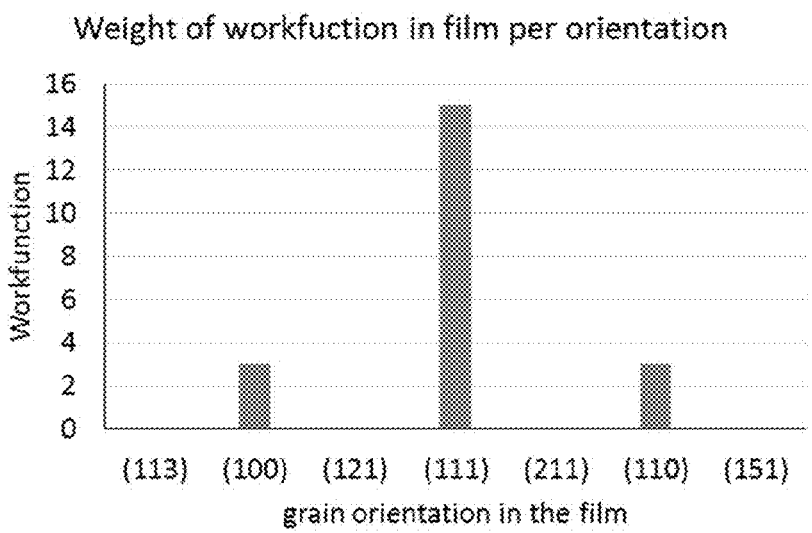
FIGS. 2A-2C illustrate differences in work function for different material types.
Figure 2B:
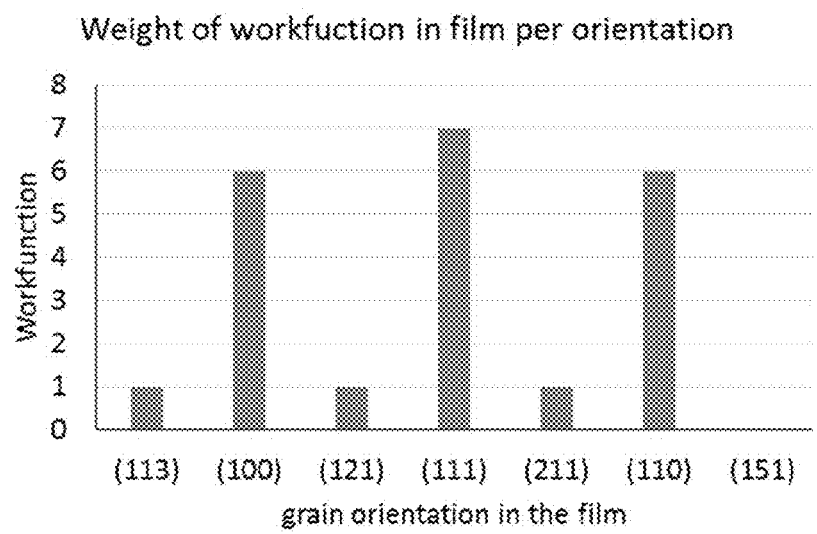
Figure 2C:
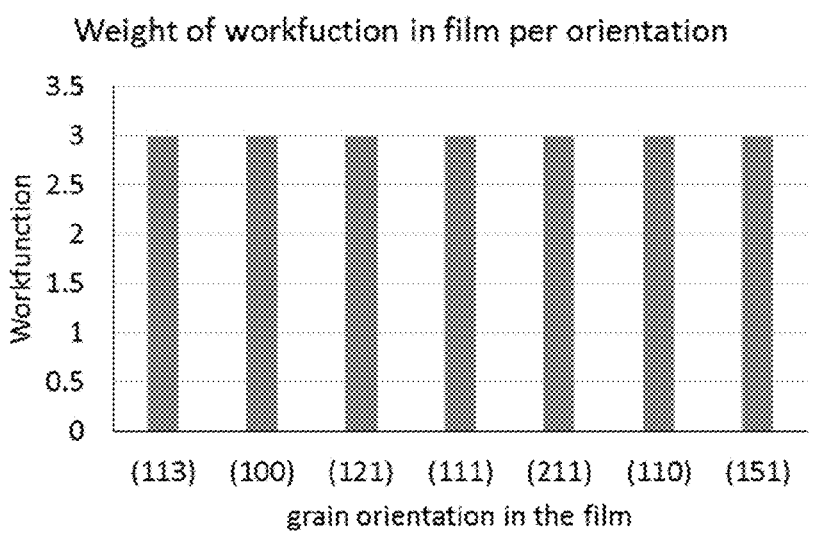
Figure 3A:
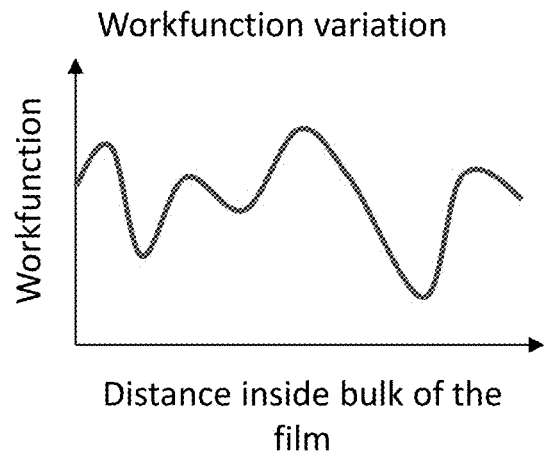
FIGS. 3A-3C illustrate work function variation over distance inside the bulk of the layer.
Figure 3B:
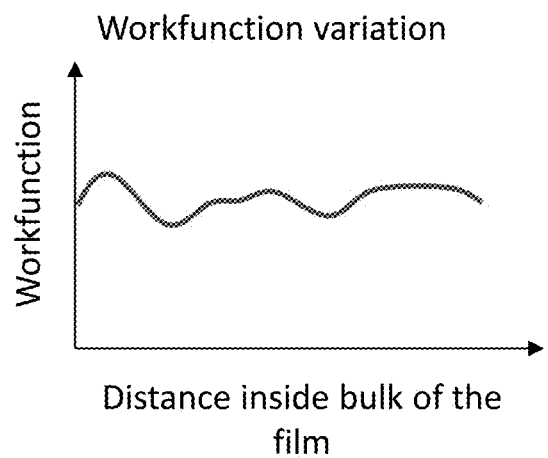
Figure 3C:
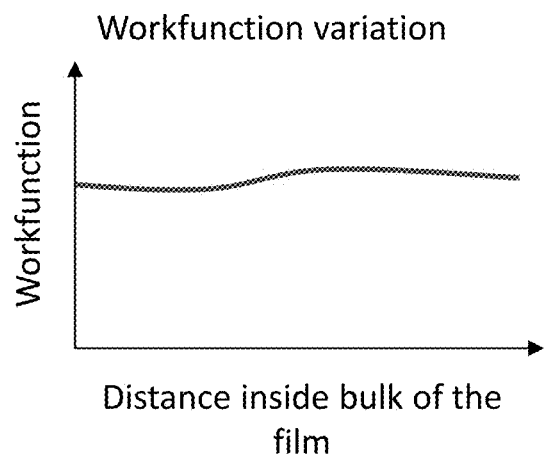
Figure 4A:
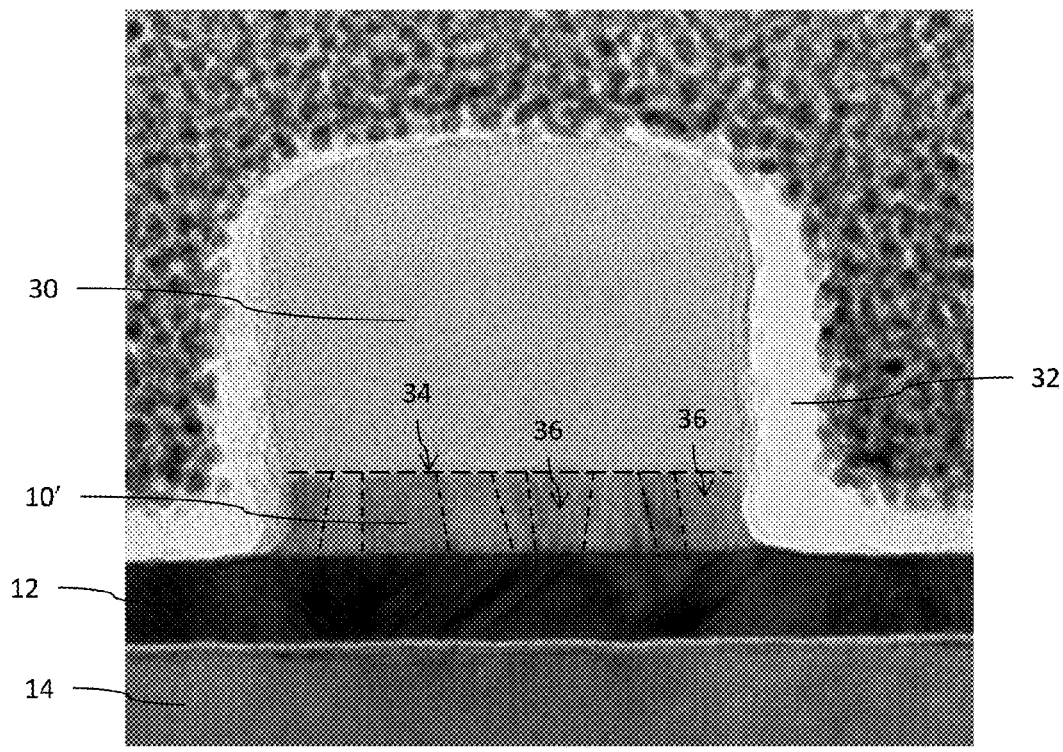
FIGS. 4A and 4B are cross-sectional images of a transistor gate region showing columnar structures in a titanium nitride work function layer.
Figure 4B:
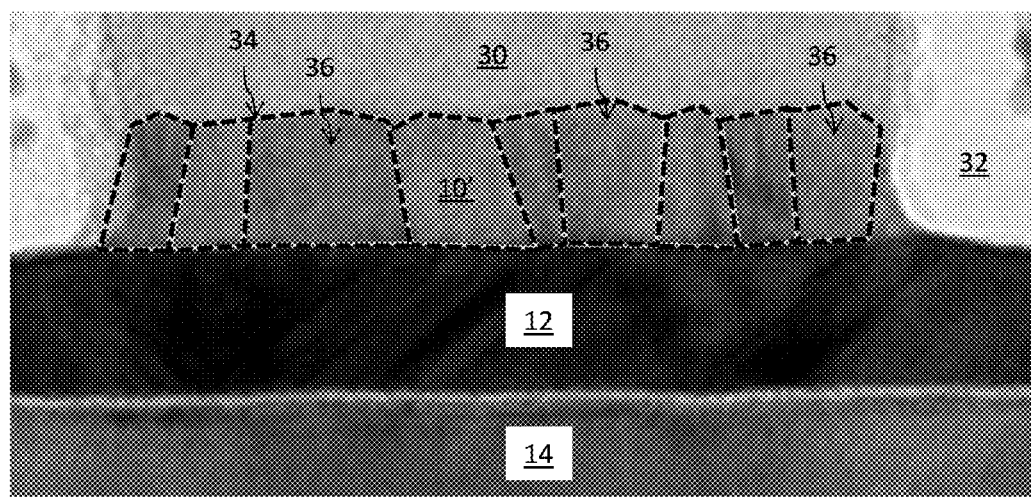
Figure 6A:
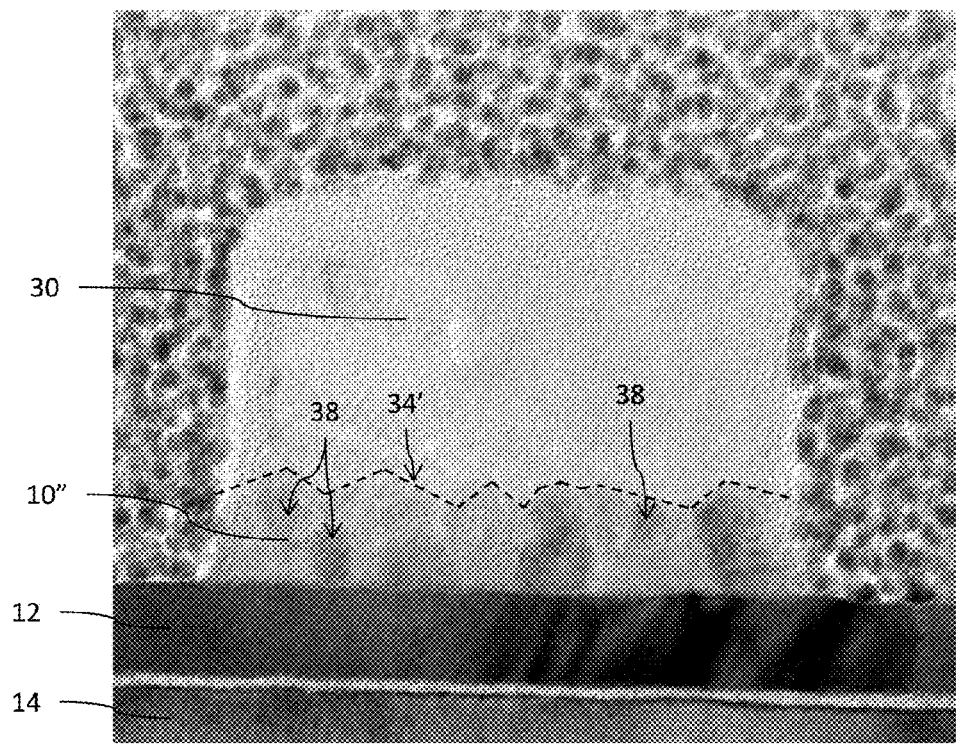
FIGS. 6A and 6B are cross-sectional images of a transistor gate region showing an equiaxed a titanium nitride work function layer.
Figure 6B:
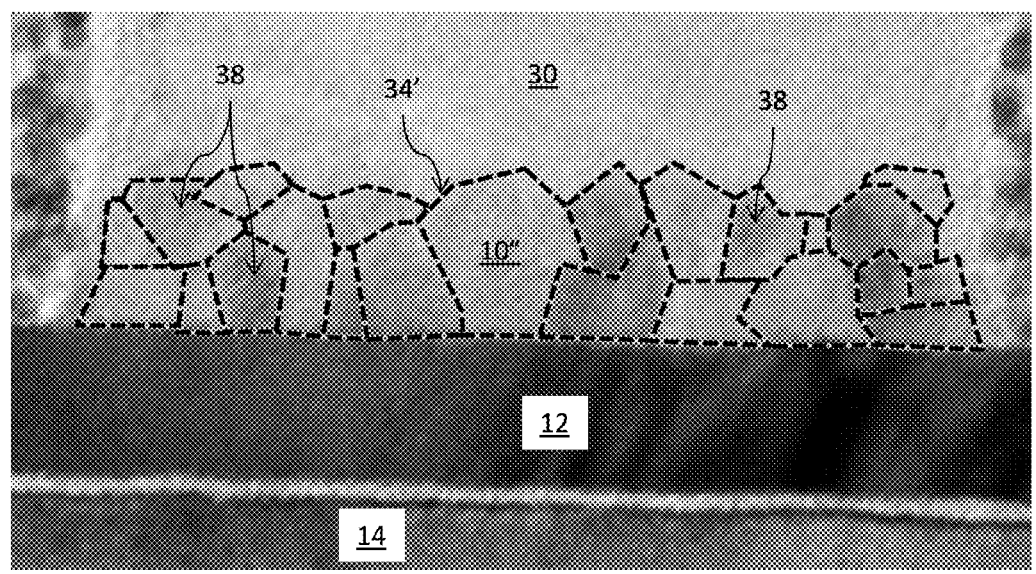

FIG. 6A shows a cross-sectional image of MOSFET device including a semiconductor substrate 14, high-k dielectric layer 12 and a TiN layer 10", wherein the TiN layer 10" exhibits an equiaxed micromorphology and a polysilicon gate electrode 30. The structure of the gate stack has a rough interface 34' between the TiN layer 10" and the polysilicon gate electrode 30. Furthermore, TiN layer 10" exhibits a number of grains 38 (shown in more detail in FIG. 6B). The image of FIG. 6B, in comparison to the image of FIG. 4B, notably further shows a lack of columnar structures. Indeed, the equiaxed structure is characterized by grains that have no preferred direction and whose shape yields a material possessing more isotropic electrical and mechanical properties in comparison to the columnar shapes of FIG. 4B.

Figure 7:
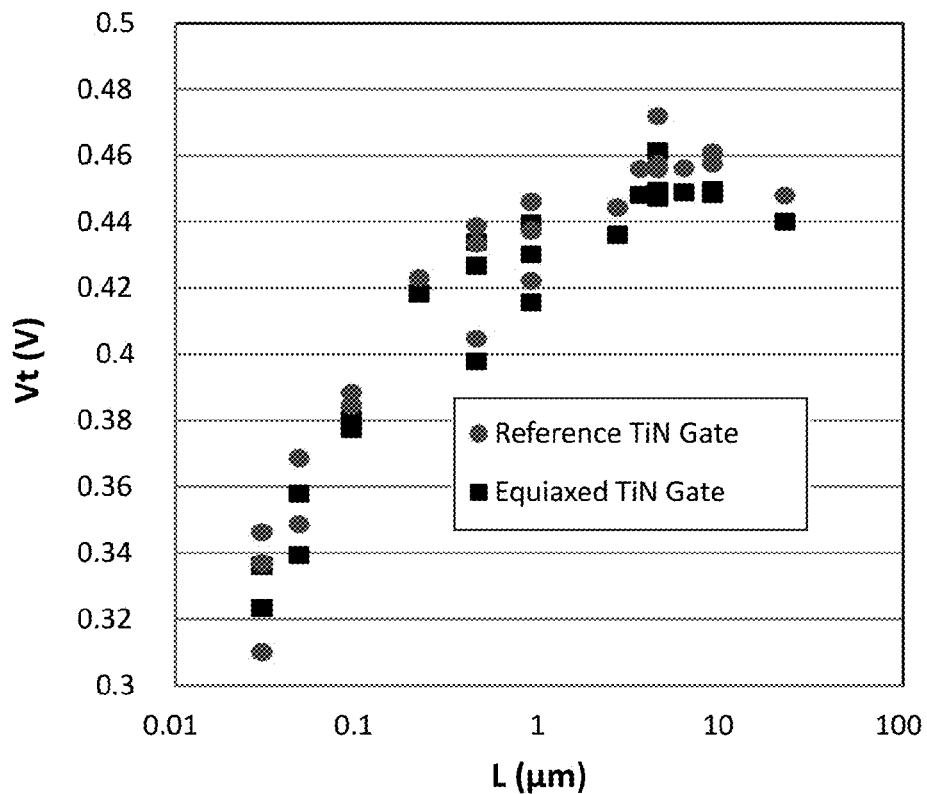
FIG. 7 is a graph plotting threshold voltage versus gate length.

FIG. 7 is a graph plotting threshold voltage (Vt) versus gate length (L) for transistors using the equiaxed TiN layer 10". FIG. 7 further plots threshold voltage (Vt) versus gate length (L) for reference transistors using a non-equiaxed TiN layer. It will be noted from FIG. 7 that there is no substantive difference in threshold voltage over gate length between the transistors using the equiaxed and non-equiaxed TiN layers. This shows that the equiaxed TiN layer 10" is fully compatible with existing circuit integrations.

Figure 8:
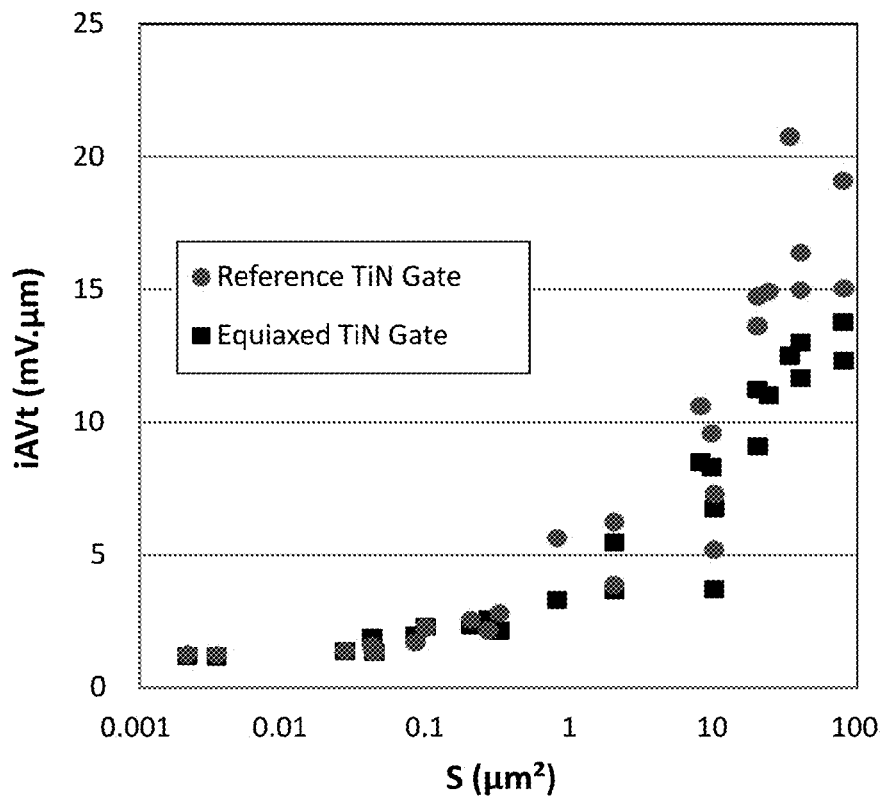
FIG. 8 is a graph plotting normalized variability in threshold voltage versus surface area=width×length.

FIG. 8 is a graph plotting normalized variability in threshold voltage (iAVt) versus surface area (S=length×width) for transistors using the equiaxed TiN layer 10". FIG. 8 further plots normalized variability in threshold voltage (iAVt) versus surface area (S) for reference transistors using a non-equiaxed TiN layer. For small surface areas of the transistor gate (for example, width×length<1 $\mu m^2$), there is no substantive difference in threshold voltage variability between the transistors using the equiaxed and non-equiaxed TiN layers. However, for larger surface areas of the transistor gate (for example, width×length>1 $\mu m^2$), there is a significant reduction in threshold voltage variability if an equiaxed TiN layer is used.

The concept of equiaxed film is applicable to all gate materials: pure materials (for example Al, Si, W, Ni, Co, Ti, Ta, Ru), metal nitrides (for example TiN, TaN, WN, AlN), metal carbides (for example TaC), and even to conductive metal oxides (for example RuO and InSnO). It relies on the averaging of grain orientation, with the help of grain size reduction if possible, in order to average gate workfunction variations, in order to reduce local variation of threshold voltage. RF-PVD allows the deposition of all these types of materials, with similar values of the process parameters. Since target voltage depends on the material type of the sputtered target, DC power must be adjusted to keep low target voltage (for example reduce DC power not to exceed 1000V target voltage) to avoid PVD failures or target debonding.

To summarize, it is noted that local variability of the grain size of the gate work function metal as well as its crystal orientation induce variable work function and local variability of the threshold voltage of MOS transistors (see, FIGS. 1A-1C, 2A-2C, 3A-3D). The inventors have discovered that deposition of the metal nitride for the work function metal of the transistor gate using RF-PVD can yield equiaxed grains (see, FIG. 5, step 52 and FIG. 6B). This process is achieved maintaining a low process temperature (with respect to conventional processes) but controlling the deposition pressure to a level greater than 7 mTorr. This low temperature process is compatible with the requirement to maintain nitrogen content in the gate oxide layer. Measurement on appropriate electrical structures produced from the process confirms that the substantially equiaxed structure for the metal nitride work function metal layer (such as with TiN) reduces local variability in threshold voltage (see, FIG. 8). The inventors believe that the more isotropic properties of equiaxed metal nitride material is the cause of the reduction in local variability in threshold voltage.

For a 28 nm gate width MOSFET comprising a 10 nm TiN layer as workfunction gate material, the inventors have observed that an equiaxial grain growth results in a TiN layer characterized by at least 2 rows of grains in vertical direction above gate oxide and least ten or more grains in horizontal direction parallel to gate oxide. (This can be viewed by TEM cross-section and if necessary measured by additional technics providing grain orientation like EBSD-TEM like (ASTAR)).

Although illustrated herein in the context of a planar MOSFET device, it will be understood that the equiaxed work function metal nitride layer may be used in any suitable integrated circuit device including all types of FET devices which utilize work function metal layers in the gate stack (for example, including, finFET devices).

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A method, comprising:
depositing a gate oxide layer over a substrate;
depositing a work function metal nitride layer over the gate oxide layer;
depositing a gate electrode layer over the work function metal nitride layer;
wherein depositing the work function metal nitride layer comprises using a deposition process that produces the work function metal nitride layer with equiaxed grains.

2. The method of claim 1, wherein said deposition process comprises physical vapor deposition in radio frequency mode (RF-PVD).

3. The method of claim 2, wherein the RF-PVD is performed at a temperature of about 20° C. and a pressure of about 10 mTorr.

4. The method of claim 2, wherein the RF-PVD is performed at a temperature of between −10° C. and 100° C. and a pressure of between 7 mTorr and 50 mTorr.

5. The method of claim 1, wherein the gate oxide layer is made of a high-k dielectric material.

6. The method of claim 1, wherein depositing the gate oxide layer comprises introducing nitrogen to adjust centering of a transistor device having a transistor gate formed from the work function metal nitride layer and gate electrode layer.

7. The method of claim 6, wherein said deposition process comprises physical vapor deposition in radio frequency mode (RF-PVD) performed at a temperature which will not desorb the nitrogen from the gate oxide layer.

8. The method of claim 1, wherein the work function metal nitride layer is made of a titanium nitride material.

9. The method of claim 1, wherein the gate electrode layer is made of a polysilicon material.

10. A method, comprising:
depositing a gate oxide layer over a substrate;
depositing over the gate oxide layer a work function metal nitride layer having equiaxed grains; and
depositing a gate electrode layer over the work function metal nitride layer with equiaxed grains.

11. The method of claim 10, wherein depositing the work function metal nitride layer with equiaxed grains comprises performing a physical vapor deposition in radio frequency mode (RF-PVD).

12. The method of claim 11, wherein the RF-PVD is performed at a temperature of about 20° C. and a pressure of about 10 mTorr.

13. The method of claim 11, wherein the RF-PVD is performed at a temperature of between −10° C. and 100° C. and a pressure of between 7 mTorr and 50 mTorr.

14. The method of claim 10, wherein the gate oxide layer is made of a high-k dielectric material.

15. The method of claim 10, wherein depositing the gate oxide layer comprises introducing nitrogen to adjust centering of a transistor device having a transistor gate formed from the work function metal nitride layer with equiaxed grains and the gate electrode layer.

16. The method of claim 15, wherein depositing the work function metal nitride layer with equiaxed grains comprises performing a physical vapor deposition in radio frequency mode (RF-PVD) at a temperature wherein nitrogen from the gate oxide layer does noe desorb.

17. The method of claim 10, wherein the work function metal nitride layer with equiaxed grains is made of a titanium nitride material.

18. The method of claim 10, wherein the gate electrode layer is made of a polysilicon material.

* * * * *